United States Patent
Dansky et al.

(10) Patent No.: US 6,323,050 B1
(45) Date of Patent: Nov. 27, 2001

(54) METHOD FOR EVALUATING DECOUPLING CAPACITOR PLACEMENT FOR VLSI CHIPS

(75) Inventors: Allan H. Dansky, Poughkeepsie; Wiren D. Becker, Hyde Park; Howard H. Smith, Beacon; Peter J. Camporese, Hopewell Junction; Kwok Fai Eng, Kingston; Dale E. Hoffman, Fishkill; Bhupindra Singh, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/677,285

(22) Filed: Oct. 2, 2000

(51) Int. Cl.[7] .................................................. H01L 21/66
(52) U.S. Cl. .............................................................. 438/17
(58) Field of Search ................................. 438/17, 14–16, 438/18, 5–13, 800

(56) References Cited

U.S. PATENT DOCUMENTS

| | | | |
|---|---|---|---|
| 5,367,469 | 11/1994 | Hartoog | 364/491 |
| 5,452,224 | 9/1995 | Smith, Jr. et al. | 364/488 |
| 5,633,532 | * 5/1997 | Sohara et al. | 257/700 |
| 5,761,080 | 6/1998 | DeCamp et al. | 364/490 |
| 6,061,508 | 5/2000 | Mehrotra et al. | 395/500 |

* cited by examiner

*Primary Examiner*—Charles Bowers
*Assistant Examiner*—Craig Thompson
(74) *Attorney, Agent, or Firm*—Lynn Augspurger; Cantor Colburn LLP

(57) ABSTRACT

A method of evaluating decoupling capacitor placement for Very Large Scale Integrated Chips (VLSI) is disclosed. Included in the method is an analysis of the usage for each decoupling capacitor, the distance from the devices, and the locations of the devices and decoupling capacitors. Also addressed are the orientations and size of the components.

17 Claims, 4 Drawing Sheets

MACRO: EXDROT_MAC

MACRO 4 CORNERS: LL_X = 30618.9 LL_Y = 6422.6 UR_Y = 6739.4
DCAP USED MORE THAN 3X LIST COUNT VALUE = 160450, DCAP XY: 30423.6 6450.8
DCAP USED MORE THAN 3X LIST COUNT VALUE = 160651 DCAP XY: 30474 6450.8
DCAP USED MORE THAN 3X LIST COUNT VALUE = 160869 DCAP XY: 30524.4 6450.8
DCAP USED MORE THAN 3X LIST COUNT VALUE = 161187 DCAP XY: 30625.2 6354.4
STEP 1 FRAME 4 CORNERS: 30418.9 6222.6 32639.6 6939.4 CAP SUM = 0.09275
EXDROT_MAC          CAP SUM AT STEP 1 = 0.09275          REQ = 0.091944

MACRO: BLHTL_MAC

MACRO 4 CORNERS: LL_X = 19727.4 LL_Y = 15629 UR_X = 25740 UR_Y = 16230.4
STEP 1 FRAME 4 CORNERS: 19527.4 15429 25940 16430.4 CAP SUM = 0.26775
STEP 2 FRAME 4 CORNERS: 19327.4 15229 26140 16630.4 CAP SUM = 0.497
STEP 3 FRAME 4 CORNERS: 19127.4 15029 26340 16830.4 CAP SUM = 0.59325

BLHTL_MAC          CAP SUM AT STEP 3 = 0.59325          REQ = 0.592819

METHOD FOR EVALUATING DECOUPLING CAPACITOR PLACEMENT FOR VLSI CHIPS

FIELD OF THE INVENTION

This invention relates to a method of evaluating decoupling capacitor placement for Very Large Scale Integrated Chips (VLSI).

BACKGROUND

As physical circuit densities on Very Large Scale Integrated (VLSI) chips increase and the performance (clock frequencies) increases, the signal integrity of on chip electrical nets becomes a major design consideration. The signal integrity of the on chip nets is a function of the electrical noise margin of the receiver circuits and the magnitude of the electrical noise affecting the nets. A source of electrical noise is the transient fluctuations of the local power supply voltages caused by the switching of circuits. The magnitude of this noise is a function of the number of simultaneous switching devices, their sizes, load capacitance, physical positions and densities on the chip, as well as the electrical characteristics of the power supply distribution.

A design technique employed to manage this transient power supply noise is to place decoupling capacitance on the power supply locally to where the sources (switching devices causing the noise) are located. These capacitors dampen the high frequency noise on the power supply distribution. Unfortunately, in typical applications the required amount of decoupling capacitance is unknown or estimated. Thus, if excess capacitance is used, valuable chip area is wasted, if insufficient capacitance is used, generated high frequency noise remains unabated. Therefore, there is a need in the art for a method for evaluating the amount of decoupling capacitance in a given area or within a given area of a noise source and determining if the decoupling capacitance employed is sufficient.

SUMMARY OF THE INVENTION

A method for analyzing decoupling capacitance (dcap) utilization by surrounding and counting components within a predefined proximal area. Included in the method is an analysis of the usage count for each dcap, the distance from the devices, and the x,y locations of the devices and dcaps. Also, taken into account are the orientations and size of the components for each instance usage. The calculations have been performed for a chip with three levels of hierarchy. That is, each chip comprises a multitude of elements termed units. Typically there are ten to twelve units to a chip, but the number may vary depending upon factors such as the size and density of the units employed. Each unit in turn, may include a multitude of macros. In common applications each unit will be comprised of several hundred macros. Again, the number may vary depending upon various factors. Finally each macro is characterized by the actual circuit topology to perform a particular desired function or process. This configuration of the chip is commonly chosen to enable concurrent design of a multitude of macros and units to shorten design and development durations. In a preferred embodiment, the macros employed in the device are under consideration.

These and other improvements are set forth in the following detailed description. For a better understanding of the invention with advantages and features, refer to the detailed description and to the drawings.

DESCRIPTION OF THE DRAWINGS

FIG. 3 depicts two illustrative examples of the process; and

The detailed description explains the preferred embodiments of the invention, together with advantages and features, by way of example with reference to the drawings.

DETAILED DESCRIPTION OF A PREFERRED EMBODIMENT

Figure 1:
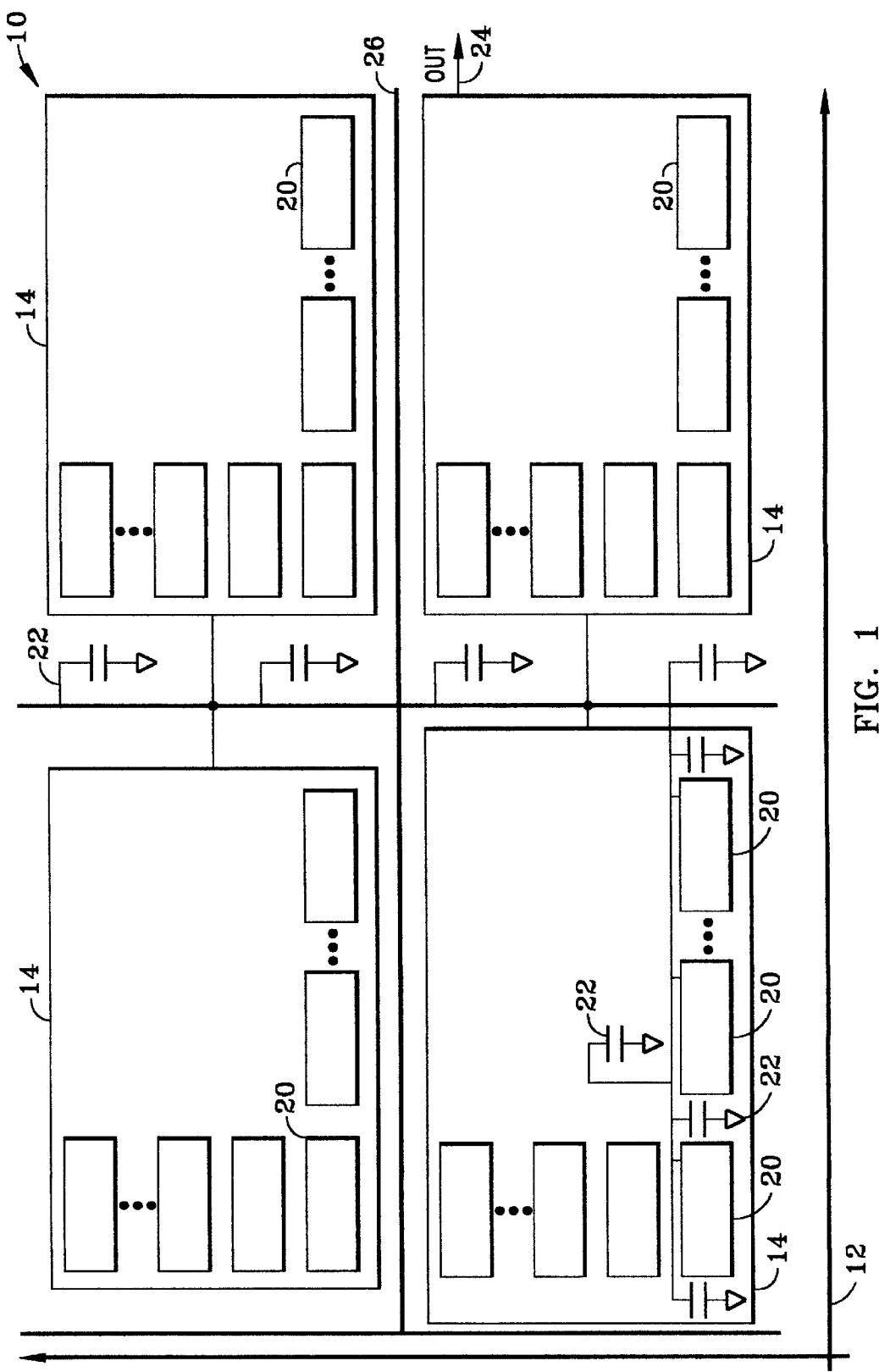
FIG. 1 depicts a typical layout of a VLSI chip.

FIG. 1 depicts a typical VLSI chip including a coordinate axis system 12. A VLSI chip 10 typically includes a multitude of units 14 which, further include several hundred macros 20 which are circuits, gates, and other components grouped together to perform a sub-function or part of the overall processing function. The macros 20 are commonly rectangularly shaped and placed nearly edge to edge without overlap. There are often spaces between the macros, which are utilized to place decoupling capacitors 22. These decoupling capacitors 22 help maintain the power supply voltages at a constant value when the circuits comprising the macros are switching and thereby creating large transient current spikes on the macro circuit outputs as well as the power supply distribution lines 26.

In a preferred embodiment, the determination process begins with each macro 20 being analyzed, using a logic simulator to determine the worst case current spike magnitude (delta-i) of the power supply currents drawn by that macro. The size of the transient current spike is unique for each macro 20 and is a dependent upon of the logic function performed. The magnitude of the transient current spike is also strongly influenced by the number of simultaneous switching latches, macro output bus drivers 24, and the load on the circuit outputs. Based on the current spike magnitude (delta-i) and the macro 20 area, a required value for total decoupling capacitance 22 (dcap) surrounding the macro 20 may be calculated.

In a preferred embodiment, circuit simulations are completed to ascertain the required decoupling for the switching circuits of the macro 20 to ensure that noise margins are maintained. Those skilled in the art will appreciate that commonly, in order to provide sufficient decoupling of the switching circuits it is desired to present, on average, approximately eight times as much quiet capacitance as switching capacitance. Switching capacitance is the capacitive load on the switching circuits. While quiet capacitance, is the total of the decoupling capacitors as well as the capacitance of the chip substrate, the power distribution lines, and non-switching circuits. The switching capacitance is determined on a per macro basis using circuit simulation to determine circuit utilization and loading.

As can be appreciated by those skilled in the art, the effectiveness of a decoupling capacitor 22 is reduced as it is moved further from the switching circuits. The decoupling effectiveness is considered in the decoupling capacitance calculation by derating the decoupling capacitance based on the distance from the switching circuit to the decoupling capacitor 22. Typically, the effectiveness of the decoupling capacitance is inversely proportional to distance from the switching circuits. The decoupling effectiveness is determined for each chip technology via modeling of the power distribution lines 26 and verification of the models with hardware measurements. As an example, assuming an 8:1 quiet capacitance requirement, and if the decoupling capacitors 22 are 75% effective at 1.5 millimeters (mm) from the switching circuits and the average distance from the switching circuit to the capacitors is 1.5 mm, then the decoupling needs to be 8/0.75=10.7 times the switching capacitance to maintain the target 8:1 ratio mentioned earlier. Therefore, by considering the decoupling effectiveness, the spatial relationship of the switching circuit to the decoupling capacitor 22 is considered and addressed in the assessment of whether a macro is properly decoupled.

The calculation of required decoupling capacitance is further refined using an assumption that the chip layout is arranged such that high-power macros 20 will be surrounded either by lower power macros or by macros 20 whose high current demand occurs at a different time. Employing this assumption, the ratio of the decoupling capacitance to the switching capacitance has a first value for macros 20 with low to average switching capacitance per unit area and a second value for macros with high switching capacitance per unit area.

These amounts of decoupling capacitance required are dependent on the particular details of the power distribution of the chip and package, and the amount of switching and non-switching capacitance. This calculation can be illustrated by the example macro as shown in FIG. 3 named exdrot_mac. For this macro, the switching capacitance is 8.3 picofarads (pF) and the macro area is 0.56 square millimeters (mm$^2$). This yields a switching capacitance density of 14.4 pF/mm$^2$. Analysis of the chip yielded a determination of an average switching capacitance density of 23.3 pf/mm$^2$. The simulations with the physical power distribution models of the chip and package indicated a need for the decoupling capacitance to be seven times the switching capacitance up to the average density and three times the switching capacitance above the average density. Thus, for this case when the switching density is less than the average, the average value is utilized to obtain the required dcap capacitance of $$Cdcap = 7*23.3 \text{ pF/mm}^2 * 0.56 \text{ mm}^2 = 91 \text{ pF as shown in FIG. 3.}$$

On the other hand, as an example of a macro with high switching power density, another model macro called clksb$_{13}$ mac which has 40 pF of switching capacitance in 0.27 mm$^2$. If this macro had average switching density, it would result in 23.3 pF/mm$^2$*0.27 mm$^2$=6.3 pf of switching capacitance. That leaves 40 pF −6.3 pF=33.7 pF of switching capacitance above the average. Thus the required capacitance is then $$C_{dcap}=(7*6.3 \text{ pF})+(3*33.7 \text{ pF})=145.2 \text{ pF}$$

A preferred embodiment provides a definition and methodology for calculating the total dcap capacitance surrounding all the macros 20 on the chip 10 and accounting for multiple usage of dcaps by several macros. The total dcap value accumulated in the vicinity of each macro 20 is compared against the required value. If it is less than the required value then additional dcaps must be provided and placed in proximity to the macro 20 until the requirement is satisfied.

Before describing the algorithms employed, some definitions and explanations of macro 20 and dcap placement coordinates will be described as well as the chip 10 "floor planned" structure to facilitate understanding of a preferred embodiment.

Referring once again to FIG. 1, the chip 10 is divided into multiple levels or hierarchies, where the highest level is the chip 10 level. The next lower level is the unit 14 level. Each chip 10 is comprised of a multitude of units 14. Typically there are ten to twelve units 14 to a chip 10, but the number may vary depending upon factors such as the size and density of the units 14 employed. The next lower level, that is, two removed from the chip 10 level is the macro 20 level. Each unit 14, may include a multitude of macros 20. In common applications each unit 14 will be comprised of several hundred macros 20. Again, the number may vary depending upon various factors. Finally each macro 20 is characterized by the actual circuit topology to perform a particular desired function or process. This configuration of the chip is commonly chosen to enable concurrent design of a multitude of macros and units to shorten design and development durations. In a preferred embodiment, he "floor planned" chip 10 consists of all the instances of the various macro 10 types (component names) placed in a coordinate system, with their instance (i.e., usage) names then translated to the unit 14 level. It is important to note that a given macro 10 type may be used many times in the complete chip 10 layout. Each macro 20 at the unit 14 level coordinate system of the chip 10 is further translated from the unit 14 level to the chip 10 level. Thereby, placing each instance of each macro 20 in the chip 10 coordinate system yielding the entire chip 10 "floor planned" at the chip 10 level. At the chip 10 level, measurements are made for each macro 20 in a coordinate system relative to the chip 10. It should be noted that, the macro 20 sizes are on the order of several millimeters (mm) on an edge, whereas the decoupling capacitors (dcaps) 22 are less than 0.1 mm per edge. Therefore, in the coordinate placement of components, the dcaps 22 may be considered as point sources located at a particular location x,y (single coordinate pair), whereas the macros 20 have a defined size, and thus, they are specified using two coordinate pairs (LL x,y and UR x,y). Where, LL stands for Lower Left, and UR stands for Upper Right. These coordinate pairs are calculated from the macro 20 placement values (the lower left hand corner location of the macro 20 in the coordinate system, orientation, and size. There are four orientation values, no rotation, mirror around x axis, mirror around y axis, and mirror around both x and y axes.

Figure 2A:
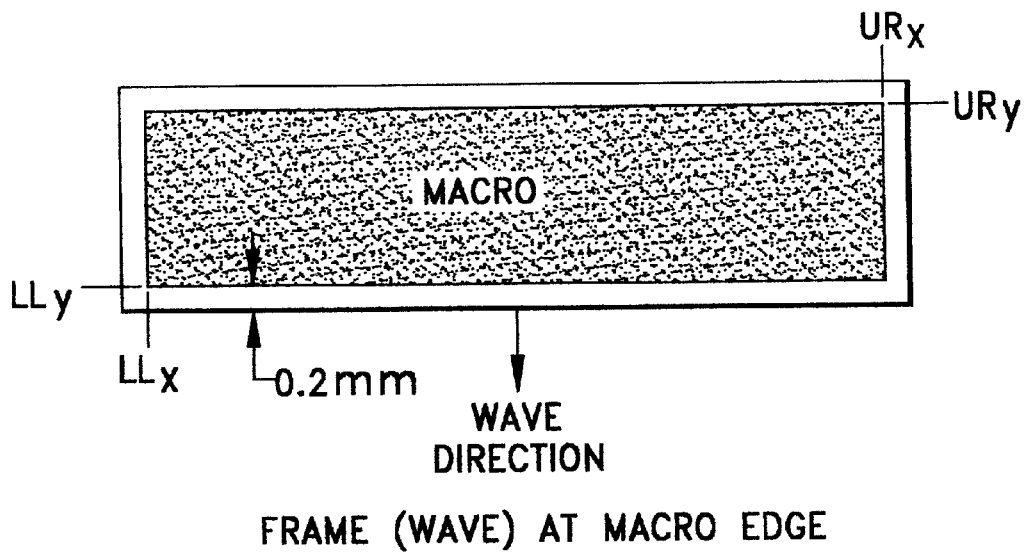
FIG. 2A depicts a macro with the frame at its edge.
Figure 2B:
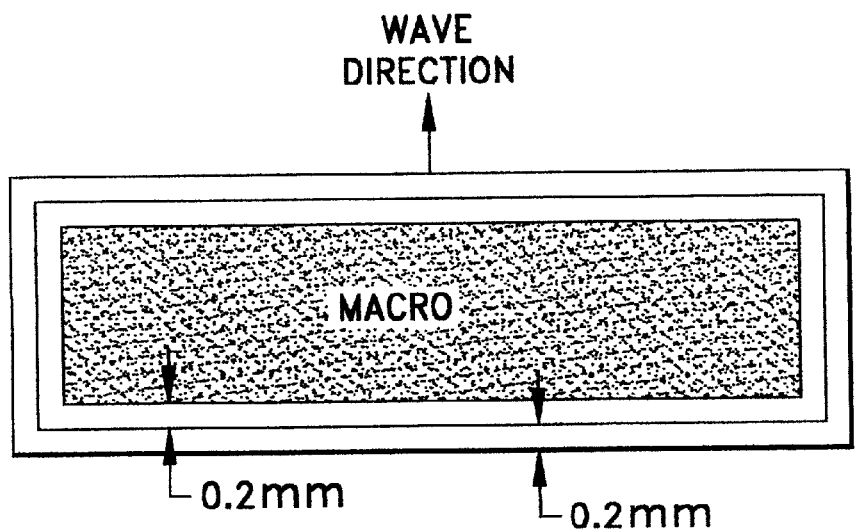
FIG. 2B depicts a macro with the frame expanded by an increment.

Referring now to FIGS. 2A and 2B, for the following explanation of processes and the algorithms employed. The following analogy will be beneficial to aid in understanding the algorithms employed in a preferred embodiment. Consider a macro 20 "thrown" into a "sea" of dcaps 22 (where no dcaps are placed within the macro boundaries). A "wave" will be created moving away from the macro 20 edges and parallel to them (similar to a stone thrown into a lake). This "wave" may be considered as a frame substantially similar to the shape of the macro, growing larger and moving outward from the macro 20 edges with successive iterations. As an example, consider a rectangular macro with the first frame equal to 0.2 mm wide and initially surrounding the perimeter of the macro 20 as depicted in FIG. 2A. The 0.2 mm may be referred to as the step size. In FIG. 2B, the 0.2 mm wide "wave" ripple has moved 0.2 mm away from the macro 20 expanding the perimeter areal or frame by 0.2 mm around the entire macro. The algorithm calculates the total dcap capacitance within the frame shown in FIG. 2A and compares it to the required value. If less than the required value, the frame (wave) is expanded away from the macro 20 by the step size to encompass a larger area (FIG. 2B) and the dcaps 22 within the increased frame are summed and added to the first case. This procedure is repeated either until the specified requirement for the dcap value is satisfied or some predetermined limit is reached. In a preferred embodiment, the limit may be a function of distance or area and address the reduction of decoupling capacitor effectiveness. Such a limit may be selected to be 1.0 mm, which is equivalent to 5 steps or iterations. If the 1.0 mm limit is reached before the sum of the dcap capacitance within that area achieves the required value, then the macro 20 under consideration does not yet have enough dcaps 22. This result may occur because there are insufficient dcaps 22 or the dcaps 22 in the vicinity have already been allocated to other macros 20 and accounted for in previous evaluations.

As a dcap 22 is used to satisfy the requirement for a macro 20, it is tagged with a usage count. When a certain usage count limit is reached for an individual dcap 22 it is eliminated from the pool of available dcaps 22 and is no longer used. The usage count limit may be a function of a variety of parameters fixed or variable. For example, the usage limit may just be a fixed number such as 4, or it might be dependent on other parameters such as the timing of each macro's delta-i spike within the cycle time. For example, an application constraint such that if a macro 20 uses a dcap 22 within a specific quartile (i.e., quarter of the clock cycle), it cannot be used in the same quartile by another macro 20.

Figure 4:
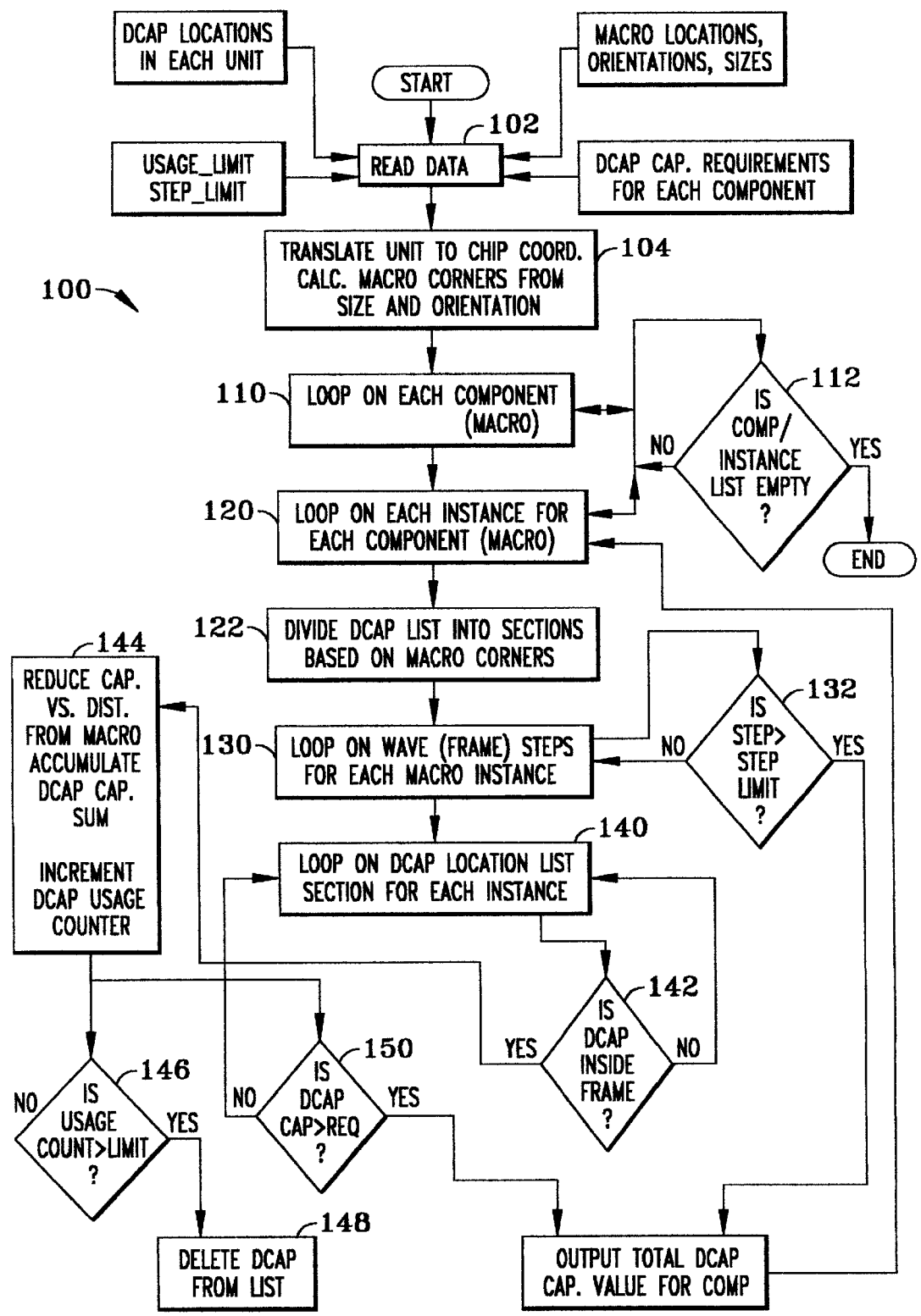
FIG. 4 depicts a chart of the process of a preferred embodiment.

FIG. 4 depicts a diagram of the process of the preferred embodiment. The processing defined would be typical of what may be performed in a controller. Such a controller may include, without limitation, a processor, logic, memory, storage, registers, timing, interrupts, and the input/output signal interfaces as required to perform the processing prescribed by a preferred embodiment. The method 100 includes 4 nested loops, namely: 1. Macro (component name) name 110; 2. Instance name 120; 3. Frame (wave) movement 130; and 4. Dcap Location List 140. Upon initiation of the method, all initial data and information for the chip, macros, limits, and current dcap locations is read at the Read Data process 102. Following which, the Translation occurs at 104, thereby placing all the components in a coordinate system with distance relationships relative to the unit coordinate system. The main Macro loop 110 initiates the process of evaluating the available dcaps for each type of macro in the chip. The loop includes termination logic and decisions at 112. The Instance loop 120 controls the process of evaluating the available dcaps for each instance of the selected macro type in the chip and is terminated by the logic and decisions also at 112. It should be noted that the process includes a subdivision 122 of the available dcap list to a section based on the coordinates of the macro corners, which minimizes the number of dcaps that must be evaluated for each step. A would be appreciated by those skilled in the art, this technique reduces the processing necessary and thus shortens the total evaluation time. The Frame loop 130 addresses the search and evaluation process for the dcaps within an iteration of the frame for each instance of each macro and also includes the termination and decision logic 132 as a function of the frame size or step count. Finally, the Dcap Location List loop 140 addresses the evaluation of the encountered dcaps within each frame, for each instance, of each macro. The loop also includes the decision logic 142 for determining that the particular dcap is within the current frame as well as the summation of the available dcap at 144. When a dcap is located inside a frame, its effective capacitance value is calculated (based on type of dcap and distance of the frame from the center of the macro. Decision process 150 address the final decision as to whether the encounter dcap exceeds the requirement. The effective capacitance is added to the existing sum until the required capacitance value is met. If it is not met, then the frame is moved out another step amount of say, 0.2 mm until either 1 mm is reached or the dcap required capacitance value is met. Blocks 146 and 148 address the dcap usage count and dcap availability.

FIG. 3 identifies an illustrative example output as applied to two macros. For the first macro, the dcap capacitance REQ (requirement=0.092 nF) is met after one step (wave movement). Also, in the first frame, 4 dcaps have reached their usage limit of 4, and are then discarded from the list so they won't be available for use by any other macros in the vicinity. The dcaps with array index values of 160450, 160651, 160869, and 161187 are deleted from the array of available dcaps. For the second macro, the REQ is 0.59 nF, and it takes 3 steps of the frame or wave moving out to 0.6 mm to obtain enough dcap capacitance to satisfy the requirement. For the second macro, none of the dcaps achieve their usage limit of 4 applications, so none are discarded.

The disclosed invention may be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or as data signal transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of evaluating decoupling capacitance in an integrated chip, comprising:

analyzing a macro of said integrated chip to predict a magnitude of a current transient generated by switching circuits of said macro;

determining a required decoupling capacitance as a function of said current transient of said macro;

processing a model of said integrated chip eliminating hierarchal aspects to generate a floor planned model including a plurality of macros; and ascertaining from said floor planned model whether an available decoupling capacitance for each instance of each macro of said plurality of macros is sufficient.

2. The method of claim 1 wherein said chip is comprised of one or more hierarchal levels including a chip level, a unit level, a macro level, a component level.

3. The method of claim 1 wherein said analyzing includes a macro level model simulation of said switching circuits and measurement and evaluation of said current transient.

4. The method of claim 1 wherein said required decoupling capacitance is determined by evaluating a ratio of switching capacitance to quiet capacitance.

5. The method of claim 1 wherein said floor planned model accounts for said each instance of each macro of said plurality of macros in each unit of said integrated chip and provides a translation into a chip level coordinate system.

6. The method of claim 5 wherein said translation provides a coordinate measurement system such that said each instance of each macro of said plurality of macros includes relative placement and orientation information.

7. The method of claim 1 wherein said ascertaining includes:
  enclosing said each instance of each macro of said plurality of macros in said floor planned model in a frame associated with said each instance of each macro of said plurality of macros;
  summing each eligible decoupling capacitance in said frame and derating to generate said available decoupling capacitance within said area;
  accounting for each utilization of each decoupling capacitor;
  comparing said available decoupling capacitance with said required decoupling capacitance; and
  expanding said frame incrementally until said available decoupling capacitance is at least about said required decoupling capacitance.

8. The method of claim 7 wherein said frame comprises an area equal to or larger than that enclosed by the borders of each instance of each macro of said plurality of macros.

9. The method of claim 7 wherein said derating is a reduction in a particular decoupling capacitance to be included in said summing as a function of distance from each said decoupling capacitance to said each instance of each macro of said plurality of macros.

10. The method of claim 7 wherein said accounting includes a first predetermined limit on the number of utilizations of a particular decoupling capacitor.

11. The method of claim 10 wherein exceeding said first predetermined limit dictates that said particular decoupling capacitor is no longer eligible for inclusion in said summing.

12. The method of claim 7 wherein said accounting includes a second predetermined limit on the number of utilizations of a particular decoupling capacitor within a predefined time constraint.

13. The method of claim 12 wherein exceeding said second predetermined limit dictates that said particular decoupling capacitor is no longer eligible for inclusion in said summing.

14. The method of claim 12 wherein said predefined time constraint includes a multiple utilizations of a particular decoupling capacitor at different time intervals.

15. The method of claim 7 wherein said expanding is limited to a predetermined number of increments.

16. The method of claim 8 wherein said expanding is limited to a predetermined limit of said area.

17. The method of claim 7 wherein said eligible decoupling capacitance may be limited to that within an vicinity of said each instance of each macro of said plurality of macros.

* * * * *

UNITED STATES PATENT AND TRADEMARK OFFICE
CERTIFICATE OF CORRECTION

PATENT NO. : 6,323,050 B1
DATED : November 27, 2001
INVENTOR(S) : Dansky et al.

It is certified that error appears in the above-identified patent and that said Letters Patent is hereby corrected as shown below:

Column 3,
Line 43, before "which has" delete "clksb$_{13}$ mac" and insert therefor -- clksb_mac --

Column 4,
Line 37, after "left hand" delete "comer" and insert therefor -- corner --

Column 5,
Line 47, after "macro" delete "comers" and insert therefor -- corners --

Signed and Sealed this

Thirty-first Day of May, 2005

JON W. DUDAS
*Director of the United States Patent and Trademark Office*